United States Patent [19]

Hanawa

[11] Patent Number: 5,449,432
[45] Date of Patent: Sep. 12, 1995

[54] METHOD OF TREATING A WORKPIECE WITH A PLASMA AND PROCESSING REACTOR HAVING PLASMA IGNITER AND INDUCTIVE COUPLER FOR SEMICONDUCTOR FABRICATION

[75] Inventor: Hiroji Hanawa, Santa Clara, Calif.

[73] Assignee: Applied Materials, Inc., Santa Clara, Calif.

[21] Appl. No.: 141,803

[22] Filed: Oct. 25, 1993

[51] Int. Cl.$^6$ .............................................. H05H 1/00
[52] U.S. Cl. ........................ 156/643.1; 156/345; 204/192.1; 204/298.06; 204/298.34; 118/723 E; 118/723 I; 118/723 MP
[58] Field of Search ............. 204/298.06, 298.08, 204/298.02, 298.31, 298.34, 192.1; 118/723 E, 723 I, 723 MP; 156/643, 345

[56] References Cited

U.S. PATENT DOCUMENTS 4,842,683  6/1989  Cheng et al. .................... 165/345
4,844,775  7/1989  Keeble ............................ 156/643

FOREIGN PATENT DOCUMENTS 0520519    6/1992   European Pat. Off. .
A-61 265,870 11/1986  Japan. .
0,528,489   2/1993   European Pat. Off. .

OTHER PUBLICATIONS

Bhattacharya, "System for Varying the Directionality in Plasma Etching", IBM Technical Disclosure Bulletin, vol. 20, No. 3, Aug. 1977.

Primary Examiner—Thi Dang
Attorney, Agent, or Firm—Robert M. Wallace; Richard T. Lyon; C. Michael Zimmerman

[57] ABSTRACT

A plasma generator for the fabrication of integrated circuit devices is described. The generator includes a separate plasma igniter electrode to apply the electrical power to a gas within a treatment chamber necessary to create a desired plasma. The plasma, once it is initiated, then is sustained by inductive coupling.

25 Claims, 1 Drawing Sheet

METHOD OF TREATING A WORKPIECE WITH A PLASMA AND PROCESSING REACTOR HAVING PLASMA IGNITER AND INDUCTIVE COUPLER FOR SEMICONDUCTOR FABRICATION

BACKGROUND OF THE INVENTION

The present invention relates to semiconductor fabrication and, more particularly, to a method of treating a workpiece with a plasma and to a processing reactor having a plasma igniter and an inductive coupler.

Integrated circuit "chips" typically are fabricated by subjecting a wafer of silicon or other semiconductive material to various processes which develop the desired circuitry in or on the wafer. Many of these processes simply can be thought of as the patterned coating or removal of materials from the wafer, or the implantation of differing species into the wafer. A multiple number of the desired circuits are typically provided on each wafer, and the wafer is then diced to provide the individual integrated circuit chips. Many of the processes and much of the technology developed for the fabrication of integrated circuitry find other uses, such as to form flat panel displays, etc.

Some of the processes mentioned above require the formation of a plasma of ions for treating one or more semiconductor wafers. Etching of a wafer for cleaning before physical vapor deposition (PVD) on such wafer is such a treatment process. A cleaning plasma typically is formed from a nonreactive gas, that is, a gas that is chemically inert to a wafer. Such gas is introduced into a chamber of the reactor having the wafer(s) to be treated, and ions or other particles are accelerated from the plasma to bombard the wafer surface. The wafers are supported within the chamber on an electrically conductive support to which RF energy is supplied to attract and accelerate the plasma ions to the wafer surface.

A problem associated with plasma treating is that it typically takes a relatively high amount of energy to create a plasma within the reactor chamber. Moreover, a plasma tends to start within a reactor chamber at one location and unevenly spread throughout the gas until it is all ignited. The trend toward increasingly dense integrated circuit geometries has resulted in integrated circuit component and device designs of very small geometry. Such small components and devices are electrically sensitive and quite susceptible to damage. It is therefore important to minimize the characteristics of the electrical parameters, e.g., the power, voltage and current, to which a wafer may be subjected during the fabrication of integrated circuitry.

Efforts have been made in the past to reduce the possibility of damage. For example, in certain PVD systems it is the practice to subject a wafer to precleaning with a low-energy, e.g., 500 w argon plasma. To this end, RF energy has been applied to coils surrounding a chamber for inductive coupling of the same into a gas within the chamber to form the plasma. Attention is directed, for example, to published European patent application 9211017.7 (Publication No. 0 520 519 A1), the subject matter of which is incorporated herein by reference. While the desired low energy RF power is all that is needed to sustain a plasma, it still takes a relatively high amount of energy to create the plasma from the argon or other gas within the chamber.

SUMMARY OF THE INVENTION

The present invention reduces the possibility that integrated circuitry being formed on a workpiece may be damaged by the ignition of a treatment plasma. A separate plasma igniter electrode is provided to apply the electrical power to the gas necessary to create the desired plasma. The plasma, once it is initiated, then is sustained by inductive coupling and the desired plasma treatment takes place. Most desirably, the application of power to the ignition electrode is discontinued once the plasma is created. If the process is plasma etching, power is applied to the support itself to attract ions from the plasma for bombardment of the wafer surface.

It is desirable that the ignition electrode be positioned at a location remote from the location at which the wafer is to be supported. This will reduce the likelihood that the high voltage which must be applied by the electrode to create the plasma will damage the integrated circuitry being formed. It is preferred that the ignition electrode be positioned outside the chamber, i.e., be physically separated from the environment in which the plasma is to be created, and the power required for the creation of the desired plasma be capacitively coupled to the gas.

The invention includes both the method of igniting a plasma separate and apart from inductively sustaining the plasma, and specific apparatus which is particularly designed to conduct the method. Other features and advantages of the invention either will become apparent or will be described in connection with the following, more detailed description of a preferred embodiment of the invention.

BRIEF DESCRIPTION OF THE DRAWING

With reference to the accompanying drawing.

DETAILED DESCRIPTION OF THE PREFERRED EMBODIMENT

The following relatively detailed description is provided to satisfy the patent statutes. However, it will be appreciated by those skilled in the art that various changes and modifications can be made without departing from the invention.

Figure 1:
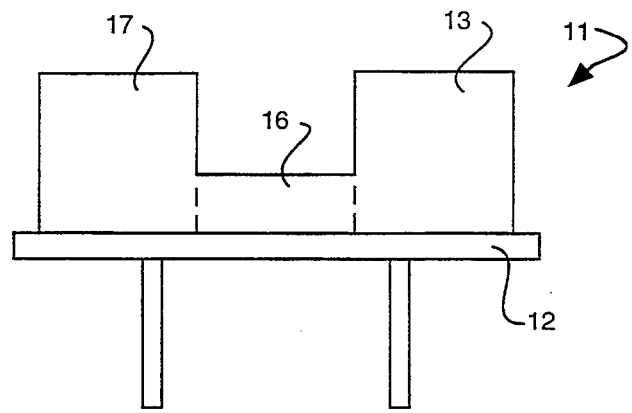
FIG. 1 is a schematic illustration of a multi-chamber reactor for treating a semiconductor wafer.

FIG. 1 schematically illustrates a multi-chamber semiconductor processing reactor, generally referred to by the reference numeral 11. Such reactor includes a supporting frame represented at 12 as well as a plurality of reactor chambers, two of which are represented at 13 and 14. A wafer transfer chamber for transferring wafers between the two chambers and/or other stations is represented at 16.

The chamber 13 is representative of an RF plasma induction chamber whereas the chamber 14 may be, for example, a deposition chamber. A system controller and other standard components are included, of course, but not shown since including them is well within the ordinary skill in the field.

Figure 2:
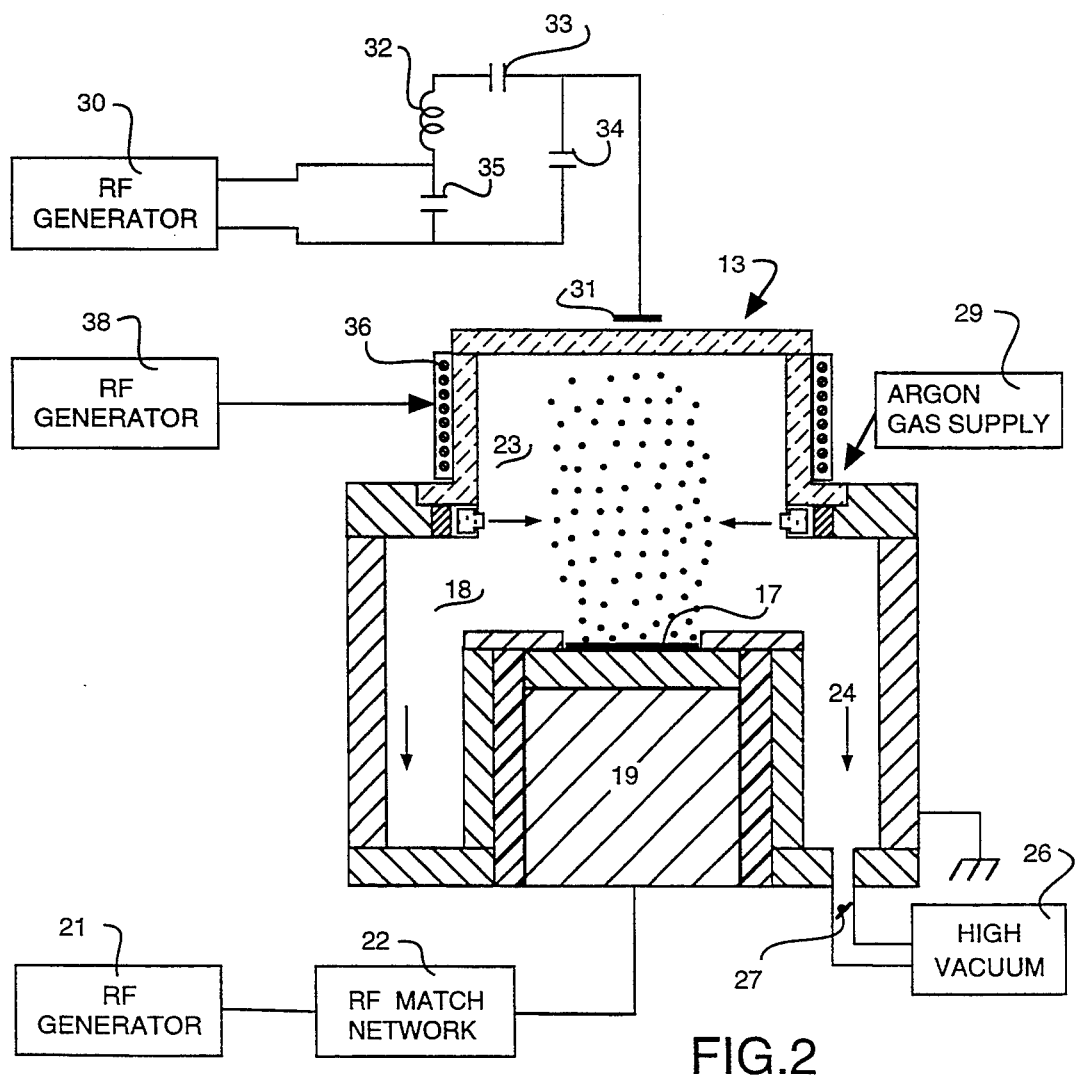
FIG. 2 is a block diagram and schematic sectional view illustrating a preferred embodiment of the apparatus of the invention.

FIG. 2 shows chamber 13 (with the standard protective cover removed) in more detail. The mechanical showing is fairly schematic and such figure also shows the electrical, gas, and vacuum arrangements in schematic form. Such chamber 13 is hermetic, and a wafer 17 to be subjected to a plasma is shown in a processing section 18 thereof. The wafer 17 is supported by the top surface of an electrically conductive support 19. An RF generator 21 is electrically coupled to the support through a matching network represented at 22 to provide power thereto for a purpose to be described subsequently.

The wafer processing section 18 includes an annulus 24 in its lower part. A high vacuum system 26 as is conventional is connected to the annulus 24 via a throttle valve schematically represented at 27 for evacuation of the chamber. In one implementation of the invention the high vacuum section 26 pumped down the chamber to a pressure of $10^{-7}$ torr.

Chamber 13 includes, besides processing section 18, an upper dome source section 23. Such section is generally discular in shape, as illustrated. Means are included for supplying a gas to the chamber from a gas supply after the chamber otherwise is evacuated. In this particular etching arrangement, such means is represented in the drawing by an annular manifold and nozzle arrangement 28. A source of argon or other gas which is nonreactive relative to the semiconductor wafer 18, is represented at 29. The gas is introduced into the chamber after it is pumped down, to provide a pressure of about 1 mtorr. It will be recognized by those skilled in the art, though, that the principles of the invention are not limited to any particular chamber pump down value, nor back-fill pressure of gas. The important thing is that the conditions are set for creation of the plasma within the chamber. It will be also recognized by those skilled in the art that the plasma may be created in structure which is not akin to a source section of a processing chamber. What is important is that the wafer be subjected to the plasma.

In keeping with the invention, an ignition electrode 31 is provided to apply electrical power to the gas in the chamber to create the desired plasma. As illustrated, such electrode is positioned outside the dome 23 to be physically separated from such gas and the plasma. This physical separation assures that such electrode will not be damaged by the gas or plasma. Power is applied to the same with a high RF voltage to create the plasma. To this end, an RF generator 30 is included for creating a 13 MHz, 200 w signal to be applied to the electrode through an electrical network. The electrical network creates a high voltage by resonation. That is, a signal from the generator is provided through an inductor 32 and capacitors 33 which create a parallel resonation. A coupling capacitor 34 is also included to adjust the input appropriately. In one design, the coupling capacitor 34 equaled 50 ohms, the inductor 32 equaled 30 $\mu$henries, the capacitors 33 and 34 equaled 100 picofarads and 50 picofarads, respectively, and the capacitor 35 equaled 1500 picofarads. The result was to provide the electrode 31 with a 15 kv signal to capacitively couple the required electrical power to the gas.

It should be noted that under certain conditions it is necessary to provide the gas with a higher pressure to ignite the same when a separate ignition electrode is used, e.g., 80 mtorr.

The invention has advantages other than merely assuring that the initiation voltage and current do not damage the wafer. For example, the treatment time with the plasma can be more reliably determined when a separate igniter electrode is used. That is, faster tuning can be achieved because there is no ignition delay associated with the inductive coupling which provides the wafer treatment.

It is to be noted that the electrode 31 is positioned to create a plasma with the gas at a location which is remote from the wafer 17. That is, it is positioned to create the plasma at the top of the dome defining the source section 23. This remote positioning reduces the likelihood that the wafer will be subjected to the current required to initiate the plasma.

It should also be noted that the electrode opposes the wafer, i.e., it faces the location in the processing section of the chamber in which the wafer is supported. Once the plasma is created, it is sustained by inductive coupling. To this end, a multiple-turn antenna coil 36 is positioned about the dome defining the source section 23 to inductively couple energy into the plasma. Preferably, the sustaining RF power is applied to the coils only after the electrode 31 has ignited the plasma.

An RF generator 38 provides an appropriate RF signal through a match network (not shown) to coil 36. It is preferred that coil 36 be tuned to resonance as described in the above-mentioned European patent application for efficient inductive coupling of energy into the plasma. It is preferable that once the plasma is created, i.e., avalanche breakdown is initiated, that the application of power to the igniter electrode 30 is discontinued. This reduces the possibility that current from the igniter electrode will reach the wafer.

The RF generator 21 is energized to cause efficient treatment. It provides RF energy of 1 kv at 13 MHz to the wafer support 19. This RF signal attracts ions and other particles from the plasma to the surface of the wafer. Preferably, the RF power is applied to the wafer support 19 only after the plasma has been ignited.

As mentioned at the beginning of the detailed description, Applicant is not limited to the specific embodiment described above. Various changes and modifications can be made. The claims, their equivalents and their equivalent language define the scope of protection.

What is claimed is:

1. In a method of treating a workpiece with a desired plasma, the steps of:
    (a) using an ignition electrode to apply electrical power to a gas to create said desired plasma;
    (b) positioning an antenna to inductively couple energy into said plasma to sustain such plasma once it has been created.

2. The method of claim 1 further including the step of discontinuing the application of electrical power to said ignition electrode once said plasma has been created.

3. The method of claim 1 wherein said step of using an ignition electrode includes locating said electrode physically separate from said gas and applying a high frequency, high wattage signal to said electrode to capacitively couple power to,said gas to create said desired plasma.

4. The method of claim 3 wherein said frequency is about 13 MHz and said wattage is about 1 Kw.

5. The method of claim 1 further including the steps of:
    (a) positioning said workpiece on an electrically conductive support located to subject said workpiece to said plasma; and
    (b) applying power to said support to attract particles from said plasma to said workpiece.

6. The method of claim 5 wherein said step of applying power to said support includes applying an RF signal thereto.

7. The method of claim 1 further including the step of positioning said ignition electrode to apply power to said gas at a location which is remote from the location at which said workpiece is to be treated.

8. In a method of treating a workpiece with a desired plasma, the steps of:
   (a) positioning said workpiece in a processing section of a reactor chamber on an electrically conductive support located to subject said workpiece to a plasma to be formed in a source section of said reactor chamber;
   (b) introducing a gas from which a plasma is to be formed into said source section chamber;
   (c) using an ignition electrode to apply electrical power with an RF signal to said gas to create said desired plasma; and
   (d) inductively coupling RF energy with an antenna into said plasma to sustain such plasma.

9. The method of claim 8 wherein said gas is a nonreactive gas.

10. The method of claim 8 further including the step of discontinuing the application of electrical power to said ignition electrode once said plasma is created.

11. A method of plasma processing a workpiece positioned in a chamber, comprising the steps of:
   (a) introducing a gas into said chamber;
   (b) applying power to an electrode to capacitively ignite said gas into a plasma;
   (c) inductively coupling RF power into said chamber; and
   (d) reducing said power applied to said ignition electrode, said plasma being maintained by said RF power and thereby processing said workpiece.

12. The method of claim 11, wherein said reducing step comprises substantially ceasing to apply said power to said electrode.

13. The method of claim 11, wherein said power applied to said electrode comprises RF power.

14. The method of claim 11, wherein said RF power is inductively coupled into said chamber only after said plasma has been ignited.

15. The method of claim 11, wherein said introducing step produces a substantially higher pressure within said chamber while said plasma is being ignited than when said workpiece is being processed by said maintained plasma.

16. The method of claim 1, wherein said electrical power applied to said gas is reduced after said plasma has been created.

17. The method of claim 1, wherein an operative amount of RF power is applied to said antenna only after said plasma has been created.

18. In processing apparatus for treating a workpiece with a plasma, the combination comprising:
   (a) an antenna positioned to inductively couple energy into a desired plasma to sustain such plasma within a reactor chamber of said apparatus; and
   (b) an ignition electrode to apply electrical power to a gas to create said desired plasma to be sustained by inductive coupling, said ignition electrode being positioned outside said chamber to capacitively couple said power to said gas when the same is within the chamber.

19. The processing apparatus combination of claim 18 further including a support within said chamber for said workpiece, which support is electrically conductive for the application thereto of electrical energy to generate an electrical field to attract particles from said plasma to said workpiece.

20. The processing apparatus combination of claim 11 further comprising:
   (a) a support within said chamber for said workpiece; and wherein,
   b) said gas is within said reactor chamber when said plasma is created, and said ignition electrode is positioned to apply electrical power to said gas at a location which is opposed to the location of said support within said chamber.

21. The processing apparatus combination of claim 11 wherein said electrode is arranged to be energized by an RF energy source to apply said electrical power to said gas.

22. The processing apparatus combination of claim 18 wherein said workpiece includes a semiconductive material, and means are included as part of said combination for supplying a gas which is nonreactive relative to said semiconductive material, from a source of the same for the creation of the desired plasma.

23. The processing apparatus combination of claim 18 wherein said ignition electrode is positioned to apply said power to said gas at a location which is remote from a location within said chamber at which said workpiece is to be positioned.

24. The processing apparatus combination of claim 18 further including means for supplying a gas to said chamber for the creation of said plasma, from a source of such gas.

25. The processing apparatus combination of claim 24 wherein said source is a source of argon.

* * * * *